United States Patent
Yamaji et al.

(10) Patent No.: US 12,313,708 B2
(45) Date of Patent: *May 27, 2025

(54) MAGNETIC SENSOR AND ITS MANUFACTURING METHOD

(71) Applicant: TDK Corporation, Tokyo (JP)

(72) Inventors: Yuichiro Yamaji, Tokyo (JP); Osamu Harakawa, Binan (PH); Makoto Kameno, Binan (PH)

(73) Assignee: TDK Corporation, Tokyo (JP)

( * ) Notice: Subject to any disclaimer, the term of this patent is extended or adjusted under 35 U.S.C. 154(b) by 167 days.

This patent is subject to a terminal disclaimer.

(21) Appl. No.: 18/040,545

(22) PCT Filed: Aug. 3, 2021

(86) PCT No.: PCT/JP2021/028803
§ 371 (c)(1),
(2) Date: Feb. 3, 2023

(87) PCT Pub. No.: WO2022/030501
PCT Pub. Date: Feb. 10, 2022

(65) Prior Publication Data
US 2023/0288503 A1    Sep. 14, 2023

(30) Foreign Application Priority Data
Aug. 7, 2020 (JP) .................................. 2020-135061

(51) Int. Cl.
*G01R 33/09*   (2006.01)
*H10N 50/80*   (2023.01)

(52) U.S. Cl.
CPC ............. *G01R 33/09* (2013.01); *H10N 50/80* (2023.02)

(58) Field of Classification Search
CPC ................ G01R 33/00; G01R 33/0035; G01R 33/0023; G01R 33/0017; G01R 31/3191;
(Continued)

(56) References Cited

U.S. PATENT DOCUMENTS

| | | | |
|---|---|---|---|
| 2012/0177949 A1* | 7/2012 | Nakae | G11B 5/73921 428/836 |
| 2014/0217533 A1* | 8/2014 | Pagani | G01R 33/04 257/427 |

(Continued)

FOREIGN PATENT DOCUMENTS

| | | | |
|---|---|---|---|
| JP | 05-212152 A | 8/1993 | |
| JP | 2012247219 A * | 12/2012 | ............. G01R 33/09 |

(Continued)

OTHER PUBLICATIONS

Extended European Search Report dated Jul. 26, 2024, from corresponding EP Application No. 21853119.2, 8 pages.
(Continued)

*Primary Examiner* — Jermele M Hollington
*Assistant Examiner* — Taqi R Nasir
(74) *Attorney, Agent, or Firm* — Rimon P.C.

(57) ABSTRACT

A magnetic sensor includes a sensor chip mounted on a substrate such that an element formation surface thereof is perpendicular to the surface of the substrate and a magnetism collecting member mounted on the substrate such that a surface thereof faces the element formation surface. The magnetism collecting member has a surface positioned on the side opposite to the surface, and both the surfaces are flattened. This reduces a gap between the element formation surface and the magnetism collecting member and reduces variations among products. In addition, since the surface is also flattened, the magnetism collecting member has no directionality with respect to the sensor chip when it is (Continued)

mounted on the substrate, so that working efficiency during assembly can be improved.

19 Claims, 7 Drawing Sheets

(58) Field of Classification Search
CPC ........ G01R 33/09; G01B 7/004; G01C 17/38; G06F 3/017; G06F 3/0346; G06F 3/012; H10N 50/80
See application file for complete search history.

(56) References Cited

U.S. PATENT DOCUMENTS

| | | | | |
|---|---|---|---|---|
| 2018/0313907 A1* | 11/2018 | Fukui | .................... | G01R 33/09 |
| 2021/0003642 A1* | 1/2021 | Tanabe | ................... | H05K 3/305 |

FOREIGN PATENT DOCUMENTS

| | | |
|---|---|---|
| JP | 2017-090192 A | 5/2017 |
| JP | 2018004618 A | 1/2018 |
| JP | 2018-194393 A | 12/2018 |
| JP | 2019144116 A | 8/2019 |

OTHER PUBLICATIONS

International Search Report issued in corresponding International Patent Application No. PCT/JP2021/028803, dated Oct. 12, 2021, with English translation.

* cited by examiner

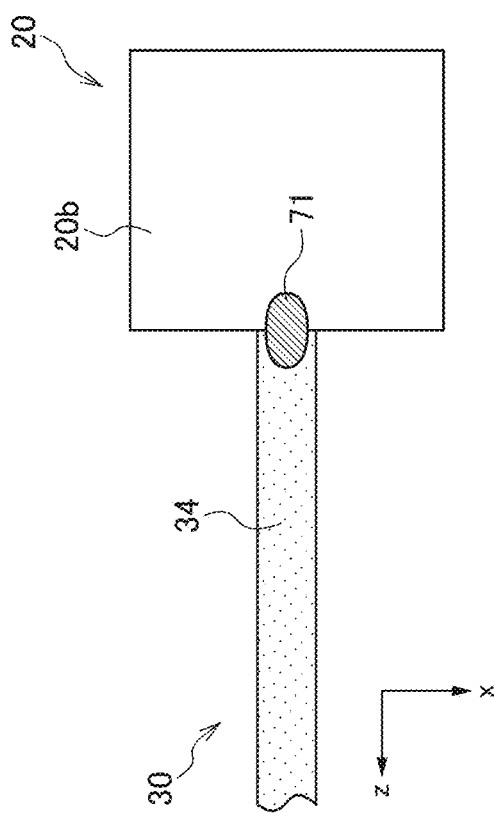
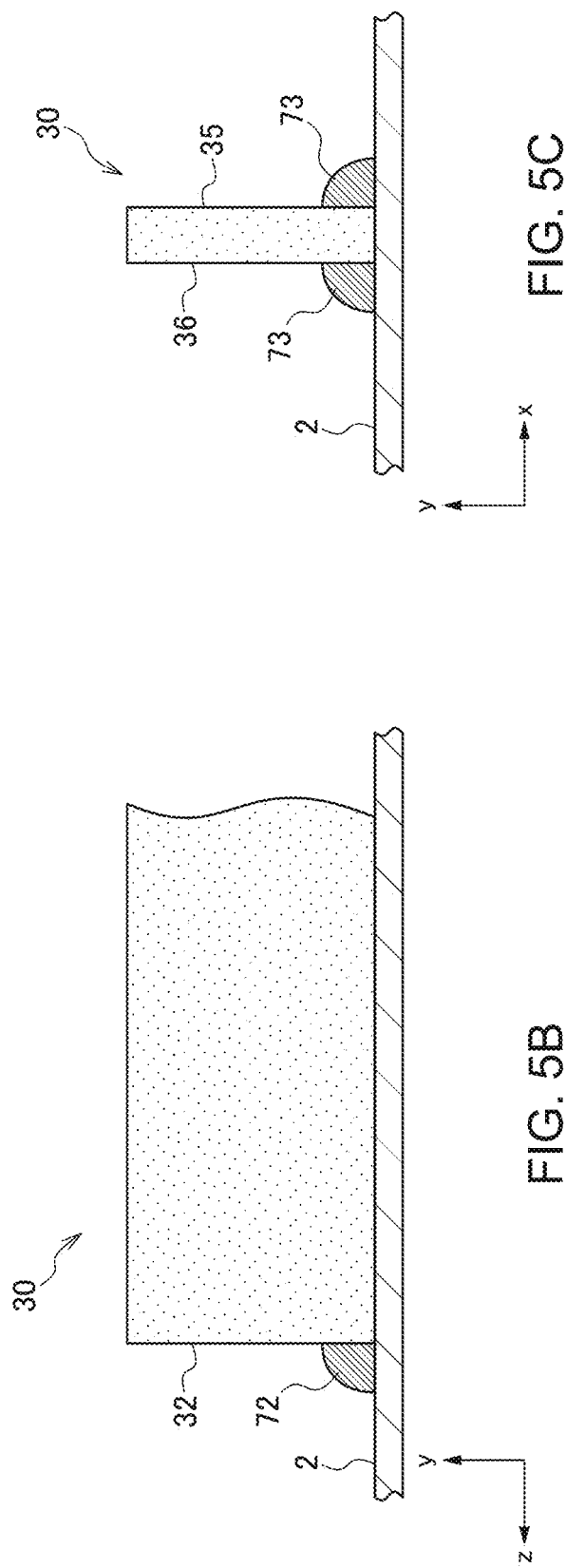

MAGNETIC SENSOR AND ITS MANUFACTURING METHOD

CROSS REFERENCE TO RELATED APPLICATIONS

This application is the U.S. National Phase under 35 U.S.C. § 371 of International Application No. PCT/JP2021/028803, filed on Aug. 3, 2021, which claims the benefit of Japanese Application No. 2020-135061, filed on Aug. 7, 2020, the entire contents of each are hereby incorporated by reference.

TECHNICAL FIELD

The present invention relates to a magnetic sensor and its manufacturing method and, more particularly, to a magnetic sensor including a sensor chip and a magnetism collecting member which are mounted on the surface of a substrate and its manufacturing method.

BACKGROUND ART

Magnetic sensors are widely used ammeters, magnetic encoders, and the like. Magnetic sensors are sometimes provided with a magnetism collecting member for collecting magnetic flux in a sensor chip so as to enhance its detection sensitivity. For example, Patent Document 1 discloses a magnetic sensor including a sensor chip mounted on a substrate such that an element formation surface thereof is perpendicular to the substrate and a magnetism collecting member mounted on the substrate such that the end portion thereof faces the element formation surface.

In the magnetic sensor described in Patent Document 1, the sensor chip is mounted on the substrate in a state of being laid at 90° such that the element formation surface is perpendicular to the substrate, so that even a long magnetism collecting member can be stably held on the substrate.

CITATION LIST

Patent Document

[Patent Document 1] JP 2017-090192A

SUMMARY OF THE INVENTION

Problem to be Solved by the Invention

However, if the magnetism collecting member has low machining accuracy, a slight gap may be generated between the element formation surface of the sensor chip and the magnetism collecting member due to imperfect contact therebetween. This gap significantly affects magnetic detection sensitivity and thus should preferably be as small as possible. Further, it is desirable to control the gap size such that variations among products fall within a certain range.

To control gap size so as to make a gap between the element formation surface of the sensor chip and the magnetism collecting member as small as possible and to make variations among products fall within a certain range, a method is available in which the surface of the magnetism collecting member that faces the element formation surface is ground or polished for flattening.

However, when the magnetism collecting member has a rectangular parallelepiped shape, flattening of only the surface that faces the element formation surface involves necessity of checking the orientation of the magnetism collecting member when it is mounted on a substrate, deteriorating working efficiency.

It is therefore an object of the present invention to provide a magnetic sensor capable of, while improving working efficiency during assembly, controlling gap size so as to make a gap between the element formation surface of a sensor chip and a magnetism collecting member as small as possible and to make variations among products fall within a certain range and a manufacturing method for such a magnetic sensor.

Means for Solving the Problem

A magnetic sensor according to the present invention includes: a substrate; a sensor chip having an element formation surface having a magnetosensitive element formed thereon and mounted on the surface of the substrate such that the element formation surface is perpendicular to the surface of the substrate; and a magnetism collecting member mounted on the surface of the substrate such that a first surface thereof faces the element formation surface of the sensor chip. The magnetism collecting member has a second surface positioned on the side opposite to the first surface, and the first and second surfaces are flattened.

According to the present invention, flatness of the first surface of the magnetism collecting member is high, so that it is possible to control gap size so as to make a gap between the element formation surface of the sensor chip and the magnetism collecting member as small as possible and to make variations among products fall within a certain range. In addition, the second surface positioned on the side opposite to the first surface is also flattened, so that the magnetism collecting member has no directionality with respect to the sensor chip when it is mounted on the substrate. This can improve working efficiency during assembly.

In the present invention, the magnetism collecting member may have a third surface facing the surface of the substrate, and the third surface may be flattened. This makes the third surface of the magnetism collecting member tightly contact the substrate with substantially no gap, so that it is possible to reduce variations in a gap between the element formation surface of the sensor chip and the magnetism collecting member due to variations in a gap between the substrate and the magnetism collecting member. In addition, friction between the third surface of the magnetism collecting member and the substrate decreases to facilitate the operation of making the magnetism collecting member abut against the sensor chip in a sliding manner on the substrate during assembly.

In the present invention, the magnetism collecting member may have a fourth surface positioned on the side opposite to the third surface, and the third and fourth surfaces may be flattened. Thus, the magnetism collecting member has no directionality with respect to the substrate when it is mounted on the substrate, thereby improving working efficiency during assembly.

In the present invention, the magnetism collecting member may have fifth and sixth surfaces each perpendicular to the first to fourth surfaces, and the fifth and sixth surfaces may be flattened. With this configuration, working efficiency during assembly can also be improved even in a product with a specification in which the magnetism collecting member is mounted with the fifth or sixth surface facing the substrate.

In the present invention, flatness of the first to fourth surfaces may be higher than that of the fifth and sixth surfaces. This can simplify a process of flattening the fifth and sixth surfaces.

In the present invention, the arithmetic mean waviness Wa of the first and second surfaces may be 0.1 μm or less. This makes it possible to significantly suppress a deterioration in detection sensitivity due to the presence of a gap between the element formation surface and the magnetism collecting member and to significantly reduce variations in detection sensitivity among products.

In the present invention, the magnetism collecting member may be made of a ferrite material. Although flatness of the ferrite material is low immediately after being cut, the first and second surfaces can be flattened through grinding or polishing.

A manufacturing method for a magnetic sensor according to the present invention includes: a first step of cutting out a magnetism collecting member from a block made of a magnetic material; a second step of grinding or polishing opposing first and second surfaces of the magnetism collecting member to flatten the first and second surfaces; a third step of mounting a sensor chip on the surface of a substrate such that an element formation surface of the sensor chip having a magnetosensitive element formed thereon is perpendicular to the surface of the substrate; and a fourth step of mounting the magnetism collecting member on the surface of the substrate such that the first surface faces the element formation surface of the sensor chip.

According to the present invention, flatness of the first surface of the magnetism collecting member is high, so that it is possible to control gap size so as to make a gap between the element formation surface of the sensor chip and the magnetism collecting member as small as possible and to make variations among products fall within a certain range. In addition, the second surface positioned on the side opposite to the first surface is also flattened, so that the magnetism collecting member has no directionality with respect to the sensor chip when it is mounted on the substrate. This can improve working efficiency during assembly.

A third surface perpendicular to the first and second surfaces may be subjected to grinding or polishing to further flatten the third surface in the second step, and the magnetism collecting member may be mounted on the surface of the substrate such that the third surface faces the surface of the substrate in the fourth step. This makes the third surface of the magnetism collecting member tightly contact the substrate with substantially no gap, so that it is possible to reduce variations in a gap between the element formation surface of the sensor chip and the magnetism collecting member due to variations in a gap between the substrate and the magnetism collecting member. In addition, friction between the third surface of the magnetism collecting member and the substrate decreases to thereby facilitate sliding of the magnetism collecting member on the substrate when the fourth step is performed with the magnetism collecting member biased so as to press the first surface of the magnetism collecting member against the element formation surface of the sensor chip.

Advantageous Effects of the Invention

As described above, according to the present invention, it is possible to control gap size so as to make a gap between the element formation surface of the sensor chip and the magnetism collecting member as small as possible and to make variations among products fall within a certain range while improving working efficiency during assembly.

BRIEF DESCRIPTION OF DRAWINGS

FIGS. 5A to 5C are schematic diagrams for explaining an applying position of adhesives 71 to 73.

MODE FOR CARRYING OUT THE INVENTION

Preferred embodiments of the present invention will be explained below in detail with reference to the accompanying drawings.

Figure 1:
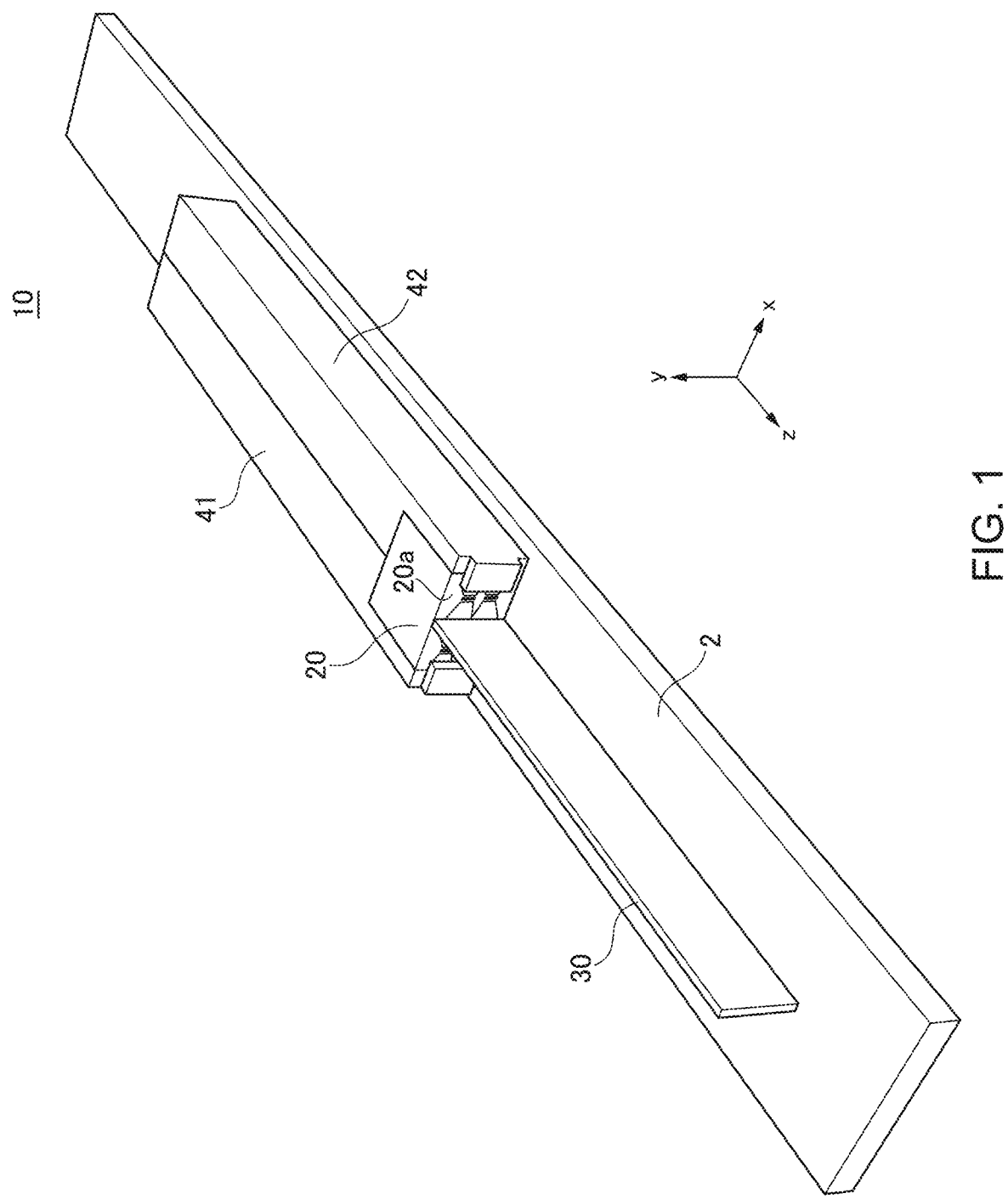
FIG. 1 is a schematic perspective view illustrating the outer appearance of a magnetic sensor 10 according to a preferred embodiment of the present invention.

FIG. 1 is a schematic perspective view illustrating the outer appearance of a magnetic sensor 10 according to a preferred embodiment of the present invention.

As illustrated in FIG. 1, the magnetic sensor 10 according to the present embodiment includes a substrate 2 whose surface constitutes the xz plane, a sensor chip 20, and magnetism collecting members 30, 41, and 42. The sensor chip 20 and magnetism collecting members 30, 41, and 42 are placed on the surface of the substrate 2. The sensor chip 20 has an element formation surface 20a constituting the xy plane, and one end of the magnetism collecting member 30 in the z-direction and the element formation surface 20a face each other. The magnetism collecting members 41 and 42 are provided on the back surface side of the sensor chip 20. The magnetism collecting members 30, 41, and 42 are each a block made of a soft magnetic material having a high permeability, such as ferrite.

As illustrated in FIG. 1, in the present embodiment, the sensor chip 20 is mounted such that the element formation surface 20a of is the sensor chip 20 perpendicular to the surface of the substrate 2. That is, the sensor chip 20 is mounted in a state of being laid at 90° with respect to the substrate 2. Thus, even when the magnetism collecting member 30 is long in the z-direction, it can be stably fixed to the substrate 2.

Figure 2:
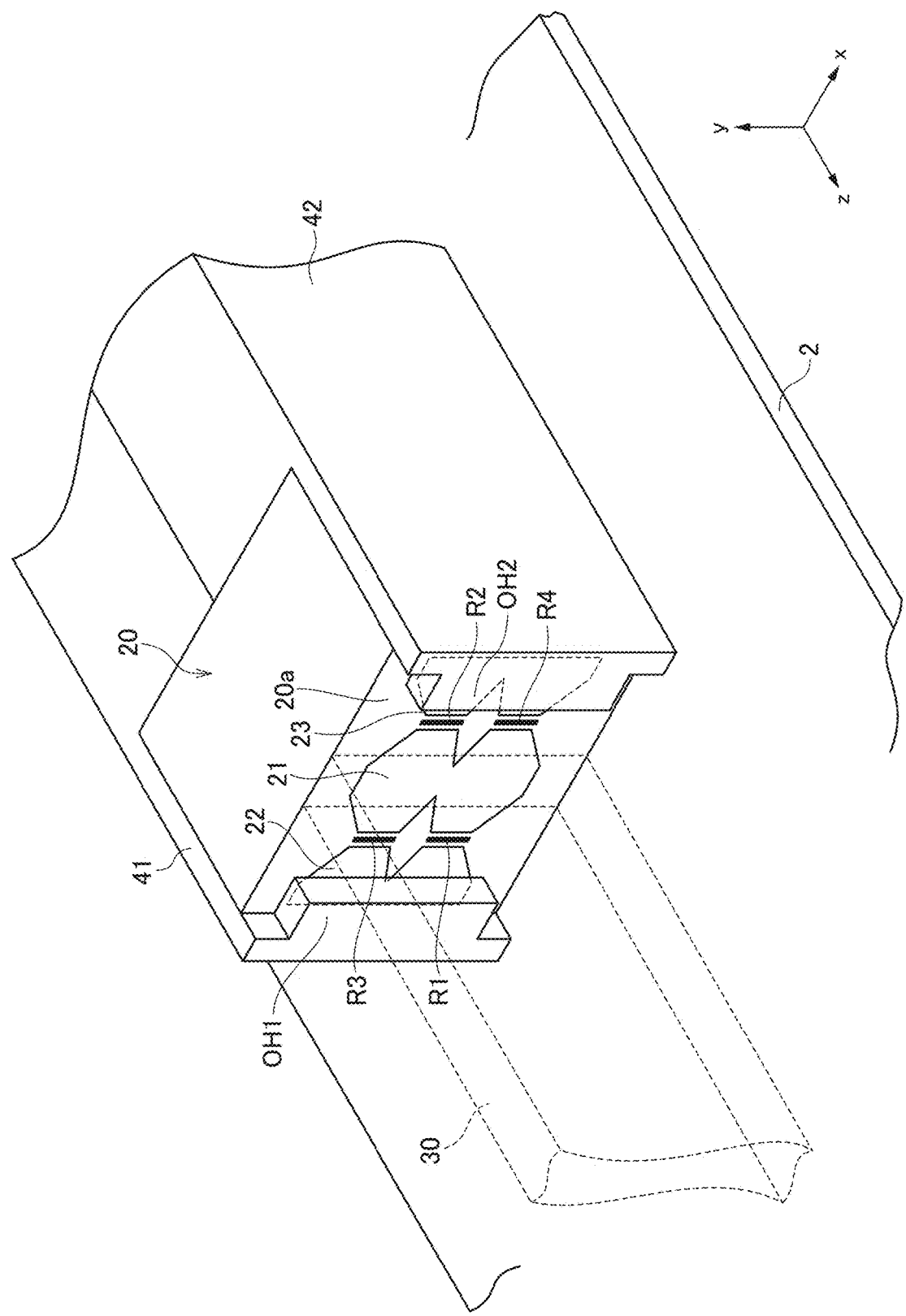
FIG. 2 is a schematic perspective view for explaining the structure of the element formation surface 20a of the sensor chip 20.

FIG. 2 is a schematic perspective view for explaining the structure of the element formation surface 20a of the sensor chip 20.

As illustrated in FIG. 2, the sensor chip 20 has a substantially rectangular parallelepiped shape and has four magnetosensitive elements R1 to R4 on the element formation surface 20a constituting the xy plane. The magnetosensitive elements R1 to R4 are not particularly limited in type as long as the characteristics thereof change according to the direction or strength of a magnetic field and may be, for example, magnetoresistive elements. In the following description, the magnetosensitive elements R1 to R4 are assumed to be magnetoresistive elements and to have the same fixed magnetization direction. The magnetosensitive elements R1 and R3 are at the same x-direction position, and the magnetosensitive elements R2 and R4 are at the same x-direction position. Further, the magnetosensitive elements R1 and R4 are at the same y-direction position, and the magnetosensitive elements R2 and R3 are at the same y-direction position.

Magnetic layers 21 to 23 are formed on the element formation surface 20a of the sensor chip 20. The magnetic layer 21 is positioned at substantially the center on the element formation surface 20a in a plan view, and the magnetic layers 22 and 23 are positioned on both sides of the magnetic layer 21 in the x-direction. Although not particularly limited, the magnetic layers 21 to 23 each a composite magnetic material may be a film made of obtained by dispersing magnetic filler in a resin material or may be a thin film or a foil made of a soft magnetic material, such as nickel or permalloy, or may be a thin film or a bulk sheet made of ferrite or the like. The magnetosensitive elements R1 and R3 are disposed in a gap between the magnetic layers 21 and 22, and the magnetosensitive elements R2 and R4 are disposed in a gap between the magnetic layers 21 and 23.

The magnetism collecting member 30 is disposed between the magnetosensitive elements R1, R3 and the magnetosensitive elements R2, R4 in a plan view, namely, as viewed in the z-direction and has a rectangular parallelepiped shape elongated in the z-direction. The magnetism collecting member 30 collects magnetic flux in the z-direction and splits the collected magnetic flux into both sides thereof in the x-direction on the element formation surface 20a. The height of the magnetism collecting member 30 in the z-direction is not particularly limited; however, when the height thereof is increased, selectivity with respect to magnetic flux in the z-direction can be improved. In the present embodiment, the width of the magnetism collecting member 30 in the y-direction substantially coincides with the width of the sensor chip 20 in the y-direction, but not limited to this.

One side surface of the sensor chip 20 and a half of the back surface thereof are covered with the magnetism collecting member 41. Similarly, the other side surface of the sensor chip 20 and the other half of the back surface thereof are covered with the magnetism collecting member 42. Although the magnetism collecting members 41 and 42 may not necessarily be provided in the present invention, the presence of the magnetism collecting members 41 and 42 can further improve selectivity with respect to the magnetic flux in the z-direction. The magnetism collecting members 41 and 42 are extended in the z-direction so as to go over the element formation surface 20a in the z-direction and have overhung parts OH1 and OH2 bent toward the element formation surface 20a side from the extended part.

Thus, as viewed in the z-direction, the magnetosensitive elements R1 and R3 are positioned between the magnetism collecting member 30 and the overhung part OH1 of the magnetism collecting member 41, and the magnetosensitive elements R2 and R4 are positioned between the magnetism collecting member 30 and the overhung part OH2 of the magnetism collecting member 42. It follows that magnetic flux collected by the magnetism collecting member 30 is substantially evenly distributed to both sides of the magnetism collecting member 30 in the x-direction and then absorbed into the magnetism collecting members 41 and 42 through the overhung parts OH1 and OH2. At this time, a part of the magnetic flux passes through the magnetosensitive elements R1 to R4. That is, magnetic fluxes in mutually opposite directions are applied to the magnetosensitive elements R1, R3 and magnetosensitive elements R2, R4.

Figure 3:
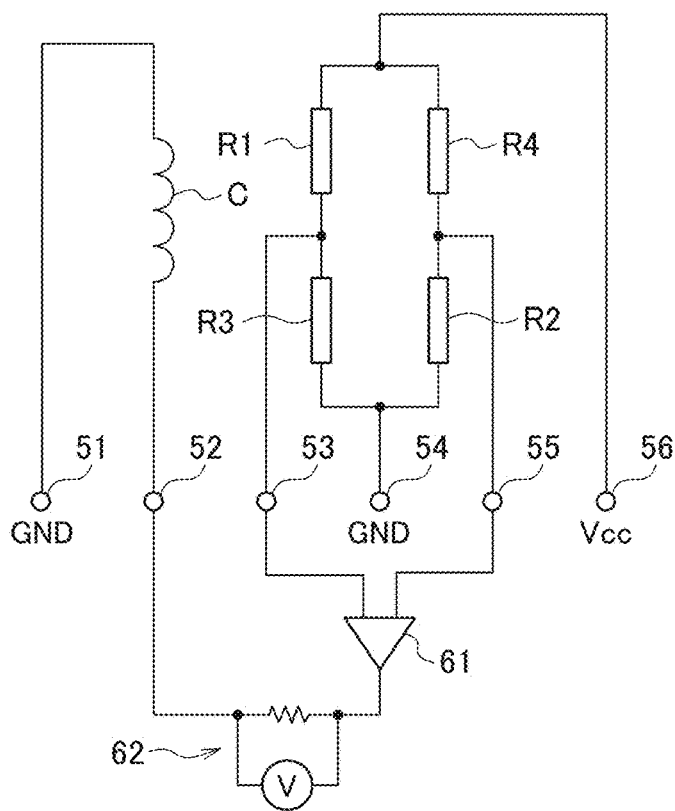
FIG. 3 is a circuit diagram for explaining the connection relation between the magnetosensitive elements R1 to R4.

FIG. 3 is a circuit diagram for explaining the connection relation between the magnetosensitive elements R1 to R4.

As illustrated in FIG. 3, the magnetosensitive element R1 is connected between the terminal electrodes 53 and 56, the magnetosensitive element R2 is connected between the terminal electrodes 54 and 55, the magnetosensitive element R3 is connected between the terminal electrodes 53 and 54, and the magnetosensitive element R4 is connected between the terminal electrodes 55 and 56. The terminal electrode 56 is applied with a power supply potential Vcc, and the terminal electrode 54 is applied with a ground potential GND. The magnetosensitive elements R1 to R4 have the same fixed magnetization direction, and a difference occurs between the resistance variation of the magnetosensitive elements R1, R3 positioned at one side as viewed from the magnetism collecting member 30 and the resistance variation of the magnetosensitive elements R2, R4 positioned at the other side as viewed from the magnetism collecting member 30. As a result, the magnetosensitive elements R1 to R4 constitute a differential bridge circuit, and thus a change in electrical resistance of the magnetosensitive elements R1 to R4 according to a magnetic flux density appears in the terminal electrodes 53 and 55.

Differential signals output from the terminal electrodes 53 and 55 are input to a differential amplifier 61 provided on or outside the substrate 2. An output signal from the differential amplifier 61 is fed back to the terminal electrode 52. As illustrated in FIG. 3, a compensation coil C is connected between the terminal electrodes 51 and 52 and thus generates a magnetic field according to the output signal from the differential amplifier 61. The compensation coil C can be integrated in the sensor chip 20. Thus, when a change in electric resistance of the magnetosensitive elements R1 to R4 according to a magnetic flux density appears in the terminal electrodes 53 and 55, a current corresponding to the magnetic flux flows in the compensation coil C to generate magnetic flux in the opposite direction, whereby the external magnetic flux is canceled. Then, by converting the current output from the differential amplifier 61 into voltage using a detection circuit 62, the strength of the external magnetic flux can be detected.

Figure 4:
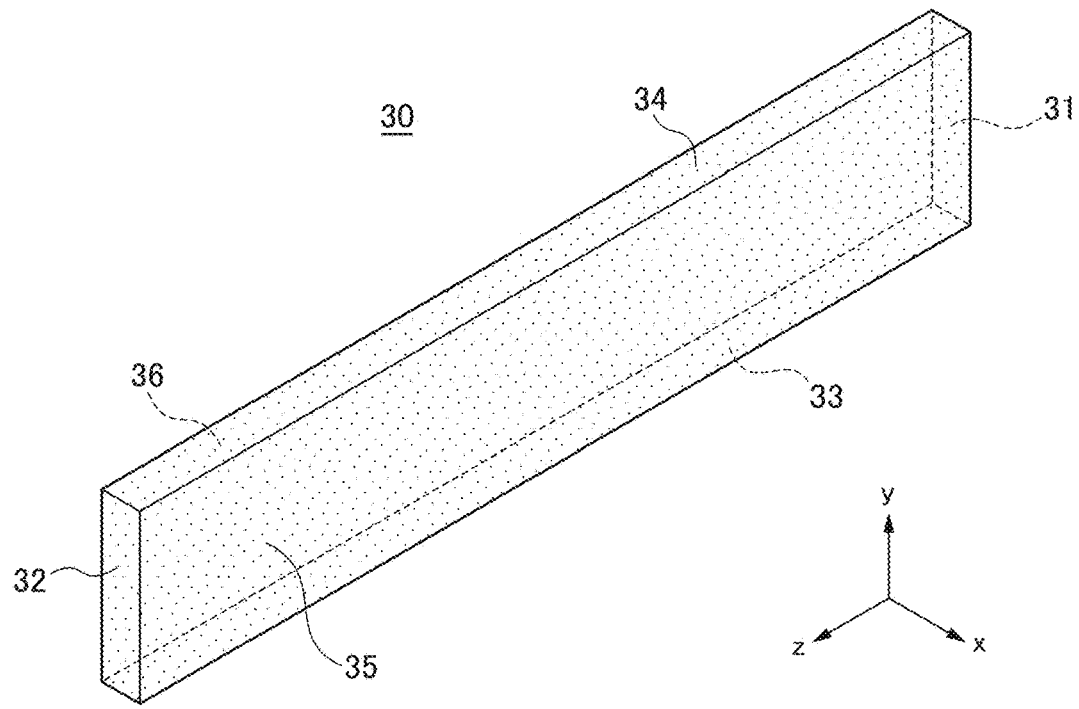
FIG. 4 is a schematic perspective view for explaining the structure of the magnetism collecting member 30.

FIG. 4 is a schematic perspective view for explaining the structure of the magnetism collecting member 30.

As illustrated in FIG. 4, the magnetism collecting member 30 has a substantially rectangular parallelepiped shape with six surfaces 31 to 36. The surface 31 constitutes the xy plane and faces the element formation surface 20a of the sensor chip 20 in a mounted state. The surface 33 constitutes the xz plane and faces the surface of the substrate 2 in a mounted state. The surface 32 constitutes the xy plane and is the surface opposite the surface 31. The surface 34 constitutes the xy plane and is the surface opposite the surface 33. The surfaces 35 and 36 constitute the yz plane and opposite to each other.

In the present embodiment, at least the surfaces 31 and 32 of the magnetism collecting member 30 are flattened. This is the result obtained by applying grinding or polishing to the surfaces 31 and 32 of the magnetism collecting member 30. Thus, when the magnetism collecting member 30 is mounted on the substrate 2, the surface 31 tightly contacts the surface of the element formation surface 20a of the sensor chip 20 with substantially no gap, making it is possible to suppress a deterioration in detection sensitivity due to the presence of a gap between the element formation surface 20a and the magnetism collecting member 30 and to reduce variations in detection sensitivity among products. Specifically, the arithmetic mean waviness Wa (specified in JIS B 0601:2013) of the surfaces 31 and 32 is preferably set to 0.1 μm or less. When the arithmetic mean waviness Wa of the surface 31 is 0.1 μm or less, it is possible to significantly suppress a deterioration in detection sensitivity due to the presence of a gap between the element formation surface 20a and the magnetism collecting member 30 and to significantly reduce variations in detection sensitivity among products. Although the surface property of the surface 32 positioned on the opposite side does not have influence on characteristics, by flattening also the surface 32, it is possible to mount the magnetism collecting member 30 on the substrate 2 with the surface 32 facing the element formation surface 20a instead of the surface 31. That is, the magnetism collecting member 30 has no directionality in the z-direction, so that working efficiency during assembly can be improved.

Further, not only the surfaces 31 and 32 of the magnetism collecting member 30, but also the surface 33 is preferably flattened. In this case, the surface 33 of the magnetism collecting member 30 tightly contacts the surface of the substrate 2 with substantially no gap. This makes the angle formed by the surfaces 31 and 33 closer to 90°, making it possible to reduce variations in a gap between the element formation surface 20a of the sensor chip 20 and the magnetism collecting member 30. In addition, friction between the surface 33 of the magnetism collecting member 30 and the substrate 2 decreases to facilitate the operation of making the magnetism collecting member 30 abut against the sensor chip 20 in a sliding manner on the substrate 2 during assembly. The arithmetic mean waviness Wa of the surface 33 may be the same as or larger than that of the surfaces 31 and 32.

Further, not only the surfaces 31 to 33 of the magnetism collecting member 30, but also the surface 34 is preferably flattened. Although the surface property of the surface 34 does not have influence on characteristics, by flattening both the surfaces 33 and 34, it is possible to mount the magnetism collecting member 30 on the substrate 2 with the surface 34 facing the substrate 2 instead of the surface 33. That is, the magnetism collecting member 30 has no directionality in the y-direction, so that working efficiency during assembly can be improved.

Further, not only the surfaces 31 to 34 of the magnetism collecting member 30, but also the surfaces 35 and 36 are preferably flattened. Although the surface property of the surfaces 35 and 36 does not have influence on characteristics, working efficiency during assembly can also be improved even in a product with a specification in which the magnetism collecting member 30 is mounted with the surface 35 or 36 facing the substrate 2. The arithmetic mean waviness Wa of the surfaces 35 and 36 may be the same as or larger than that of the surfaces 31 to 34. In the latter case, the operation of flattening the surfaces 35 and 36 can be simplified.

As illustrated in FIGS. 5A to 5C, the magnetism collecting member 30 can be fixed using adhesives 71 to 73. In the example of FIG. 5A, the adhesive 71 is applied over the surface 34 of the magnetism collecting member 30 and a top surface (xz plane) 20b of the sensor chip 20, whereby the relative positional relation between the sensor chip 20 and the magnetism collecting member 30 is fixed. The surface 34 of the magnetism collecting member 30 may be rougher than the surfaces 31 and 32. Thus, as compared to when the surface 34 of the magnetism collecting member 30 has flatness equivalent to that of the surfaces 31 and 32, adhesive strength of the adhesive 71 can be enhanced. When the adhesive 71 enters between the surface 31 of the magnetism collecting member 30 and the element formation surface 20a, a gap therebetween may become wider; however, in the present embodiment, flatness of the surface 31 of the magnetism collecting member 30 is high, so that entering of the adhesive 71 due to surface tension is less likely to occur.

In the example illustrated in FIG. 5B, the adhesive 72 is applied over the surface 32 of the magnetism collecting member 30 and the surface of the substrate 2, whereby the relative positional relation between the substrate 2 and the magnetism collecting member 30 is fixed.

In the example illustrated in FIG. 5C, the adhesive 73 is applied over the surfaces 35 and 36 of the magnetism collecting member 30 and the surface of the substrate 2, whereby the relative positional relation between the substrate 2 and the magnetism collecting member 30 is fixed. The surfaces 35 and 36 of the magnetism collecting member 30 may be rougher than the surfaces 31 and 32. Thus, as compared to when the surfaces 35 and 36 of the magnetism collecting member 30 have flatness equivalent to that of the surfaces 31 and 32, adhesive strength of the adhesive 73 can be enhanced.

However, in the present invention, not all the adhesives 71 to 73 are necessary, but some adhesives (e.g., adhesive 73) may be omitted.

Figure 6:
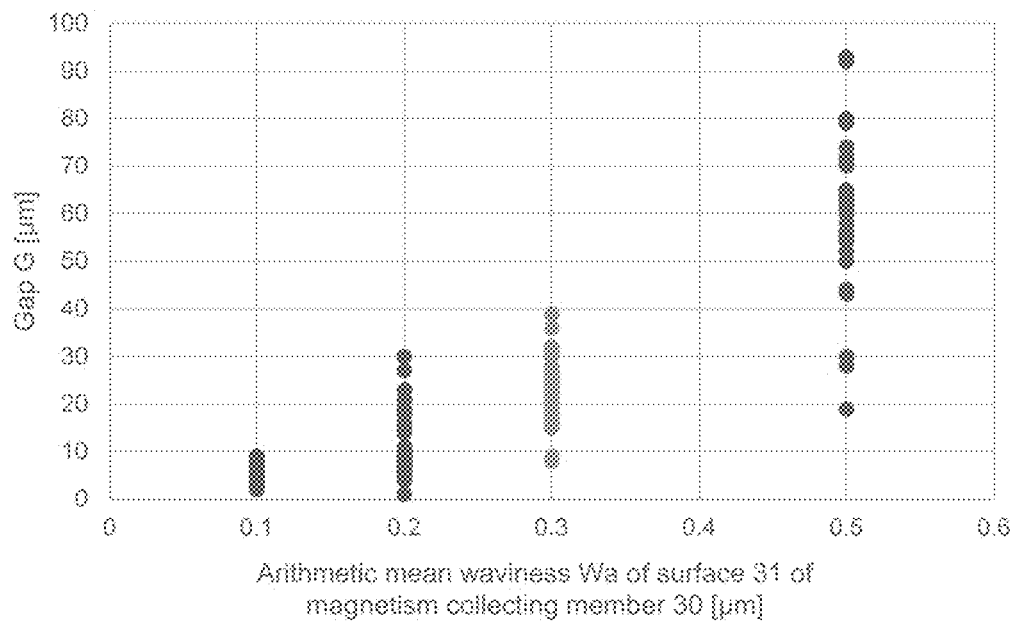
FIG. 6 is a graph illustrating the relation between the arithmetic mean waviness Wa of the surface 31 of the magnetism collecting member 30 and a gap G between the element formation surface 20a and the magnetism collecting member 30.

FIG. 6 is a graph illustrating the relation between the arithmetic mean waviness Wa of the surface 31 of the magnetism collecting member 30 and a gap G between the element formation surface 20a and the magnetism collecting member 30.

As illustrated in FIG. 6, in a plurality of samples in which the arithmetic mean waviness Wa of the surface 31 is 0.5 μm, the actual measurement value of the gap G significantly varies between about 20 μm and about 100 μm. The value of the gap G and variations therein decrease as the arithmetic mean waviness Wa of the surface 31 becomes smaller. Specifically, in a plurality of samples in which the Wa is 0.3 μm, the actual measurement value of the gap G is between about 10 μm and about 40 μm (variations of about 30 μm); in a plurality of samples in which the Wa is 0.2 μm, the actual measurement value of the gap G is between about 0 μm and about 30 μm (variations of about 30 μm); and in a plurality of samples in which the Wa is 0.1 μm, the actual measurement value of the gap G is between about 0 μm and about 10 μm (variations of about 10 μm). Thus, when the Wa is 0.1 μm, it is possible to not only reduce the absolute value of the gap G but also to significantly reduce variations in the gap G. The smaller the arithmetic mean waviness Wa of the surface 31, the better the characteristics become. However, although depending on material characteristics of the magnetism collecting member 30 and a polishing method applied thereto, it is realistically difficult to reduce the arithmetic mean waviness Wa to less than 0.01 μm. Considering this, a realistic value of the Wa is 0.01 μm or more and 0.1 μm or less, preferably, 0.03 μm or more and 0.05 μm or less.

Figure 7:
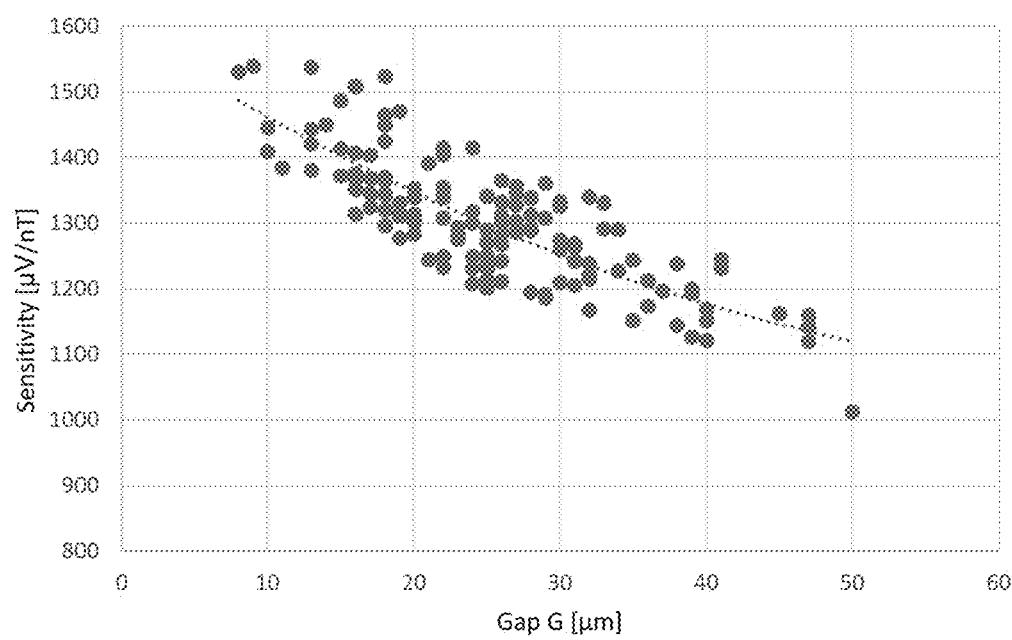
FIG. 7 is a graph illustrating the relation between the gap G and the sensitivity of the magnetic sensor 10.

FIG. 7 is a graph illustrating the relation between the gap G and the sensitivity of the magnetic sensor 10.

As can been clearly seen from FIG. 7, the sensitivity of the magnetic sensor 10 tends to increase as the gap G decreases, although it is not univocally determined. That is, the smaller the arithmetic mean waviness Wa of the surface 31, the higher the sensitivity of the magnetic sensor 10 becomes. By flattening the surface 31 so as to reduce the arithmetic mean waviness Wa thereof to 0.1 μm or less, it is possible to achieve high sensitivity and to significantly reduce variations in sensitivity.

The following describes a manufacturing method for the magnetic sensor 10 according to the present embodiment.

Figure 8:
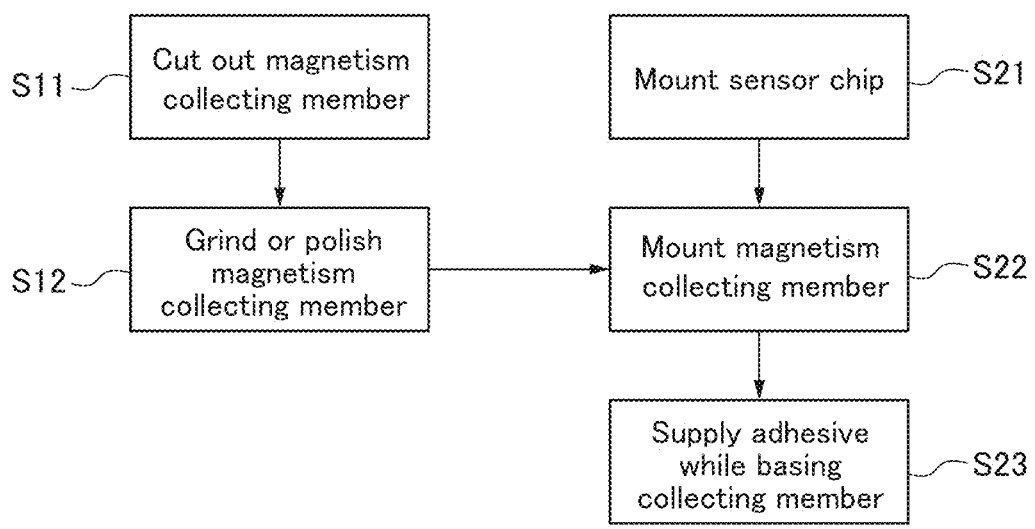
FIG. 8 is a flowchart for explaining a manufacturing process for the magnetic sensor 10.

FIG. 8 is a flowchart for explaining a manufacturing process for the magnetic sensor 10 according to the present embodiment.

First, the magnetism collecting member 30 is cut out from a block made of a magnetic material such as ferrite (step S11), and then at least the surfaces 31 and 32 of the magnetism collecting member 30 are ground or polished to enhance the flatness of the surfaces 31 and 32 (step S12). Immediately after the magnetism collecting member 30 is cut out, flatness of the surfaces 31 to 36 is low. However, applying grinding or polishing to the surfaces 31 and 32 of the magnetism collecting member 30 enhances the flatness of the surfaces 31 and 32. In step S12, the surfaces 33 and 34 may also be flattened through grinding or polishing, or all the surfaces 31 to 36 may also be flattened through grinding or polishing. Flattening the surface 33 allows the angle formed by the surfaces 31 and 33 to be extremely close to 90°.

Concurrently with the machining for the magnetism collecting member 30, the sensor chip 20 is mounted on the substrate 2 such that the element formation surface 20a is perpendicular to the substrate 2 (step S21). After that, the machined magnetism collecting member 30 is mounted on the surface of the substrate 2 (step S22). The magnetism collecting member 30 is mounted such that the surfaces 33 and 31 face the surface of the substrate 2 and the element formation surface 20a of the sensor chip 20, respectively. As described above, flatness of the surface 31 of the magnetism collecting member 30 is high, making the surface 31 of the magnetism collecting member 30 tightly contact the element formation surface 20a of the sensor chip 20 with substantially no gap. When mounting the magnetism collecting member 30, it is not necessary to check the orientation of the magnetism collecting member 30 in the z-direction, and the surface 32 may be made to tightly contact the element formation surface 20a instead of the surface 31.

Figure 9:
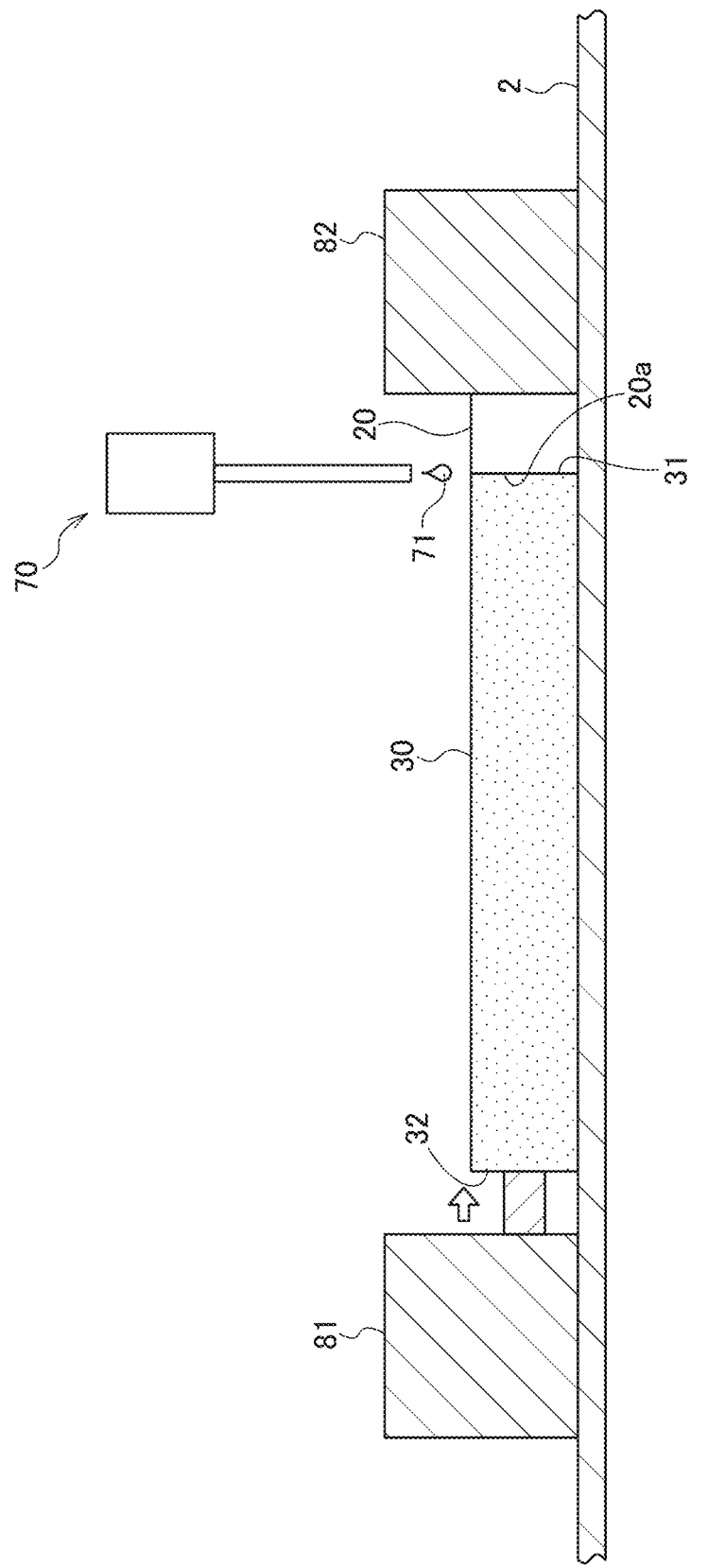
FIG. 9 is a schematic diagram for explaining a method for supplying and curing the adhesive 71 with the magnetism collecting member 30 biased.

Then, the adhesives 71 to 73 are supplied and cured to fix the magnetism collecting member 30 (step S23). At this time, the adhesives are preferably supplied and cured with the magnetism collecting member 30 biased so as to properly press the surface 31 of the magnetism collecting member 30 against the element formation surface 20a of the sensor chip 20. For example, as illustrated in FIG. 9, after the magnetism collecting member 30 is mounted on the substrate 2, the adhesive 71 is preferably supplied from a dispenser 70 in a state where the magnetism collecting member 30 is biased in the negative z-direction from the surface 32 side with a biasing tool 81. In this case, the back surface side of the sensor chip 20 is preferably supported with a fixing tool 82 so as to prevent the sensor chip 20 from moving or coming down in the negative z-direction. By supplying and curing the adhesive 71 while using the tools 81 and 82, it is possible to keep a state where the surface 31 of the magnetism collecting member 30 is properly pressed against the element formation surface 20a of the sensor chip 20 and to prevent entering of the adhesive 71 between the surface 31 of the magnetism collecting member 30 and element formation surface 20a of the sensor chip 20. When the surface 33 of the magnetism collecting member 30 is also flattened, friction between the magnetism collecting member 30 and the substrate 2 decreases to facilitate the operation of making the magnetism collecting member 30 abut against the sensor chip 20 in a sliding manner on the substrate 2.

Similarly, the adhesives 72 and 73 are supplied and cured in such a fixed state using the tools 81 and 82.

As described above, in the magnetic sensor 10 according to the present embodiment, flatness of the surfaces 31 and 32 of the magnetism collecting member 30 is enhanced, thus making the surface 31 of the magnetism collecting member 30 tightly contact the element formation surface 20a of the sensor chip 20 with substantially no gap. Further, the adhesive 71 is less likely to enter between the surface 32 of the magnetism collecting member 30 and the element formation surface 20a of the sensor chip 20. Furthermore, the magnetism collecting member 30 has no directionality in the z-direction, thus eliminating the need to check the orientation of the magnetism collecting member 30 in the z-direction, which improves working efficiency.

It is apparent that the present invention is not limited to the above embodiments, but may be modified and changed without departing from the scope and spirit of the invention.

REFERENCE SIGNS LIST 2 substrate
10 magnetic sensor
20 sensor chip
20a element formation surface
20b top surface of sensor chip
21-23 magnetic layer
30, 41, 42 magnetism collecting member
31-36 surface of magnetism collecting member
51-56 terminal electrode
61 differential amplifier
62 detection circuit
70 dispenser
71-73 adhesive
81 biasing tool
82 fixing tool
C compensation coil
OH1, OH2 overhung part
R1-R4 magnetosensitive element

The invention claimed is:

1. A magnetic sensor comprising:
    a substrate;
    a sensor chip having an element formation surface having a magnetosensitive element formed thereon and mounted on a surface of the substrate such that the element formation surface is perpendicular to the surface of the substrate; and
    a magnetism collecting member mounted on the surface of the substrate such that a first surface thereof faces the element formation surface of the sensor chip,
    wherein the magnetism collecting member has a second surface positioned on a side opposite to the first surface, a third surface perpendicular to the first and second surfaces and facing the surface of the substrate, and a fourth surface positioned on a side opposite to the third surface, and
    wherein the first and second surfaces are flattened such that a flatness of the first and second surfaces is higher than a flatness of the third and fourth surfaces.

2. The magnetic sensor as claimed in claim 1,
    wherein the magnetism collecting member has fifth and sixth surfaces each perpendicular to the first to fourth surfaces, and
    wherein the flatness of the third and fourth surfaces is higher than a flatness of the fifth and sixth surfaces.

3. The magnetic sensor as claimed in claim 1, wherein an arithmetic mean waviness Wa of the first and second surfaces is 0.1 μm or less.

4. The magnetic sensor as claimed in claim 1, wherein the magnetism collecting member is made of a ferrite material.

5. The magnetic sensor as claimed in claim 1, further comprising a first adhesive fixing the magnetism collecting member to the sensor chip.

6. The magnetic sensor as claimed in claim 5,
wherein the sensor chip further has a top surface perpendicular to the element formation surface, and
wherein the first adhesive is applied over the fourth surface of the magnetism collecting member and the top surface of the sensor chip.

7. The magnetic sensor as claimed in claim 6, further comprising a second adhesive applied over the second surface of the magnetism collecting member and the surface of the substrate.

8. The magnetic sensor as claimed in claim 1, further comprising an adhesive applied over the second surface of the magnetism collecting member and the surface of the substrate.

9. A method for manufacturing a magnetic sensor, the method comprising:
a first step of cutting out a magnetism collecting member from a block made of a magnetic material;
a second step of grinding or polishing opposing first and second surfaces of the magnetism collecting member to flatten the first and second surfaces;
a third step of mounting a sensor chip on a surface of a substrate such that an element formation surface of the sensor chip having a magnetosensitive element formed thereon is perpendicular to the surface of the substrate; and
a fourth step of mounting the magnetism collecting member on the surface of the substrate such that the first surface faces the element formation surface of the sensor chip, and that a third surface of the magnetism collecting member perpendicular to the first and second surfaces faces the surface of the substrate,
wherein the magnetism collecting member further has a fourth surface positioned on a side opposite to the third surface, and
wherein, in the second step, grinding or polishing the first and second surfaces so that a flatness of the first and second surfaces is greater than a flatness of the third and fourth surfaces.

10. The method for manufacturing a magnetic sensor as claimed in claim 9, wherein the fourth step is performed with the magnetism collecting member biased so as to press the first surface of the magnetism collecting member against the element formation surface of the sensor chip.

11. The method for manufacturing a magnetic sensor as claimed in claim 9,
wherein the magnetism collecting member further has fifth and sixth surfaces each perpendicular to the first to fourth surfaces, and
wherein, in the second step, grinding or polishing the third and fourth surfaces so that a flatness of the third and fourth surfaces is greater than a flatness of the fifth and sixth surfaces.

12. The method for manufacturing a magnetic sensor as claimed in claim 9, further comprising a fifth step of applying an adhesive over the sensor chip and the fourth surface of the magnetism collecting member.

13. A magnetic sensor comprising:
a substrate having a main surface;
a sensor chip having an element formation surface having a magnetosensitive element formed thereon and mounted on the main surface of the substrate such that the element formation surface is perpendicular to the main surface of the substrate; and
a magnetism collecting member mounted on the main surface of the substrate,
wherein the magnetism collecting member has a first surface facing the element formation surface of the sensor chip, a second surface positioned on a side opposite to the first surface, a third surface perpendicular to the first and second surfaces and facing the main surface of the substrate, a fourth surface positioned on a side opposite to the third surface, a fifth surface perpendicular to the first to fourth surfaces, and a sixth surface positioned on a side opposite to the third surface,
wherein the first surface is higher in flatness than the third surface, and
wherein the third surface is higher in flatness than the fifth surface.

14. The magnetic sensor as claimed in claim 13, wherein the second surface is higher in flatness than the fourth surface.

15. The magnetic sensor as claimed in claim 14, wherein each of the first and second surfaces is higher in flatness than each of the third and fourth surfaces.

16. The magnetic sensor as claimed in claim 15, wherein the fourth surface is higher in flatness than the sixth surface.

17. The magnetic sensor as claimed in claim 16, wherein each of the third and fourth surfaces is higher in flatness than each of the fifth and sixth surfaces.

18. The magnetic sensor as claimed in claim 13, further comprising a first adhesive is applied over the fourth surface of the magnetism collecting member and the sensor chip.

19. The magnetic sensor as claimed in claim 18, further comprising a second adhesive applied over the second surface of the magnetism collecting member and the main surface of the substrate.

* * * * *